(12) United States Patent
Ito et al.

(10) Patent No.: US 6,858,358 B2
(45) Date of Patent: Feb. 22, 2005

US006858358B2

(54) PHOTOSENSITIVE TRANSFER MATERIAL COMPRISING THERMOPLASTIC RESIN LAYER AND INTERMEDIATE LAYER EACH HAVING SPECIFIED SURFACE POTENTIAL, AND METHOD FOR PRODUCING COLOR FILTER

(75) Inventors: Hideaki Ito, Shizuoka-ken (JP); Akira Hatakeyama, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/736,588

(22) Filed: Dec. 17, 2003

(65) Prior Publication Data
US 2004/0126681 A1 Jul. 1, 2004

(30) Foreign Application Priority Data
Dec. 25, 2002 (JP) ........................................ 2002-373690

(51) Int. Cl.[7] ................................................ G02B 5/20
(52) U.S. Cl. ........................................... 430/7; 430/260
(58) Field of Search ............................ 430/7, 259, 260, 430/262

(56) References Cited

U.S. PATENT DOCUMENTS 5,292,613 A * 3/1994 Sato et al. .................. 430/257

FOREIGN PATENT DOCUMENTS

| JP | 11-149008 A | 6/1999 |
| JP | 2002-219878 A | 8/2002 |

* cited by examiner

Primary Examiner—John A. McPherson
(74) Attorney, Agent, or Firm—Sughrue Mion, PLLC

(57) ABSTRACT

A photosensitive transfer material comprising a temporary support, a thermoplastic resin layer, an alkali-soluble intermediate layer, and an alkali-soluble photosensitive resin layer including a pigment in this order, wherein, when the thermoplastic resin layer and the intermediate layer are separated from each other at a separation speed of 1 m/min under an atmosphere of 25° C. and 30% RH, both an absolute value of a surface potential of the separated thermoplastic resin layer and that of the separated intermediate layer are no more than 5 kV; and a method for producing a color filter by using the photosensitive transfer material.

16 Claims, No Drawings

PHOTOSENSITIVE TRANSFER MATERIAL COMPRISING THERMOPLASTIC RESIN LAYER AND INTERMEDIATE LAYER EACH HAVING SPECIFIED SURFACE POTENTIAL, AND METHOD FOR PRODUCING COLOR FILTER

CROSS-REFERENCE TO RELATED APPLICATION

This application claims priority under 35 USC 119 from Japanese Patent Application No. 2002-373690, the disclosure of which is incorporated by reference herein.

BACKGROUND OF THE INVENTION

1. Field of the Invention

The present invention relates to a photosensitive transfer material, and specifically to a photosensitive transfer material for producing a color filter for a color liquid crystal display, and also relates to a method for producing the color filter.

2. Description of the Related Art

Photosensitive transfer materials for producing color filters for color liquid crystal displays are publicly known. For example, a photosensitive transfer material having a temporary support, a thermoplastic resin layer, an alkali-soluble intermediate layer, and an alkali-soluble photosensitive resin layer including a pigment in this order, is described in Japanese Patent Application Laid-Open (JP-A) Nos. 2002-219878 and 11-149008. In these inventions, the photosensitive resin layer of the photosensitive transfer material is attached to a substrate generally by using a "lamination method", and thereafter, the temporary support is separated therefrom, followed by exposure and development to form an image on the substrate.

This method causes a problem in that when the temporary support is separated after the lamination step, the temporary support and the surface separated from the temporary support (i.e., the surface of the layer directly applied to the temporary support at the photosensitive transfer material formation step) are electrostatically charged.

This problem may also occur when the thermoplastic resin layer and the intermediate layer are separated from each other.

Although the charged voltage cannot be absolutely determined as it varies depending on the environmental temperature and humidity, and on the separation speed, it may be ±10 kV or more, which causes the following problems. A first problem is that dust is attracted by static electricity, which results in defective pixels. A second problem is that when a color filter is formed on an array of thin-film transistors (TFTs) on a transparent substrate (Color Filter On Array-CoA method), the thin-film transistors are broken by electrostatic charge caused by separation of the temporary support. Since the production speed of color filters has accelerated in recent years, consequently also accelerating the separation speed of temporary supports, these problems have become even more critical.

In order to solve these problems, there is a method in which a "static eliminator" is provided in the production line. However, the static eliminator cannot sufficiently reduce the voltage resulting from the electrostatic charge caused by the separation, and therefore there has been a need for countermeasures.

Thus, there has been a desire for a photosensitive transfer material, whereby when the thermoplastic resin layer and the intermediate layer are separated from each other, the surface potentials of the separated surfaces of the layers are low.

Further, there has also been a desire for a method for producing a color filter by using the photosensitive transfer material.

SUMMARY OF THE INVENTION

A first aspect of the present invention is a photosensitive transfer material comprising a temporary support, a thermoplastic resin layer, an alkali-soluble intermediate layer, and an alkali-soluble photosensitive resin layer including a pigment in this order, wherein, when the thermoplastic resin layer and the intermediate layer are separated from each other at a separation speed of 1 m/min under an atmosphere of 25° C. and 30% RH, both an absolute value of a surface potential of the separated thermoplastic resin layer and that of the separated intermediate layer are no more than 5 kV.

A second aspect of the present invention is a method for producing a color filter by using a photosensitive transfer material comprising a temporary support, a thermoplastic resin layer, an alkali-soluble intermediate layer, and an alkali-soluble photosensitive resin layer including a pigment in this order, the method comprising steps of laminating the photosensitive transfer material on a substrate and separating the thermoplastic resin layer and the intermediate layer from each other, wherein, when the thermoplastic resin layer and the intermediate layer are separated from each other at a separation speed of 1 m/min under an atmosphere of 25° C. and 30% RH, both an absolute value of a surface potential of the separated thermoplastic resin layer and that of the separated intermediate layer are no more than 5 kV.

DETAILED DESCRIPTION OF THE INVENTION

Photosensitive Transfer Material

A photosensitive transfer material of the present invention has a temporary support, a thermoplastic resin layer, an alkali-soluble intermediate layer, and an alkali-soluble photosensitive resin layer including a pigment in this order, wherein, when the thermoplastic resin layer and the intermediate layer are separated from each other at a separation speed of 1 m/ min under an atmosphere of 25° C. and 30% RH, both an absolute value of a surface potential of the separated thermoplastic resin layer and that of the separated intermediate layer are no more than 5 kV. Hereinafter, a photosensitive transfer material of the present invention, and a method for producing a color filter by using the photosensitive transfer material, will be described.

Temporary Support

As the temporary support in the invention, known supports can be used, which are made of polyester, polystyrene or the like. In particular, biaxially oriented polyethylene terephthalate is preferable from the viewpoints of cost, heat resistance and dimensional stability. The thickness of the temporary support is preferably about 15 to 200 μm, and more preferably about 30 to 150 μm. When the thickness is within the range from 15 to 200 μm, no corrugation is generated by heat at a lamination step, and the cost is not affected disadvantageously.

If necessary, the temporary support may have a conductive layer, a charge adjustment layer, a release layer, an undercoat layer, and/or other applied/deposited layers. When the temporary support has one or more of these layers thereon, the whole including the layers is referred to as a temporary support.

The release layer is applied to the outermost surface of the temporary support in order to increase a separation force between the temporary support and the adjacent layer applied thereto.

The undercoat layer is applied to the temporary support for various purposes of providing slip, abrasion resistance and the like.

The conductive layer and the charge adjustment layer will be described later. These layers are generally provided by application, but may be provided by deposition or other methods.

Alkali Solubility

"Alkali-soluble" used in the invention means "soluble in an aqueous solution of an alkaline substance selected from the following examples", or "soluble in a mixture of such a solution and an organic solvent which is miscible with water".

Preferred examples of the alkaline substance include alkali metal hydroxides (e.g., sodium hydroxide and potassium hydroxide), alkali metal carbonates (e.g., sodium carbonate and potassium carbonate), alkali metal bicarbonates (e.g., sodium bicarbonate and potassium bicarbonate), alkali metal silicates (e.g., sodium silicate and potassium silicate), alkali metal metasilicates (e.g., sodium metasilicate and potassium metasilicate), triethanolamine, diethanolamine, monoethanolamine, morpholine, tetraalkylammonium hydroxides (e.g., tetramethylammonium hydroxide), and trisodium phosphate. The concentration of the alkaline substance is preferably 0.01 to 30% by mass, and the pH of the solution or mixture is preferably 8 to 14.

Preferred examples of the organic solvent, which is miscible with water, include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl lactate, methyl lactate, ε-caprolactam, and N-methylpyrolidone. The concentration of the organic solvent, which is miscible with water, is 0.1 to 30% by mass. Further, a known surfactant can also be added to the solution. The concentration of the surfactant is preferably 0.01 to 10% by mass.

Thermoplastic Resin Layer

Examples of a resin for forming the thermoplastic resin layer in the invention include acrylic resins, polystyrene resins, polyester, polyurethane, gum resins, vinyl acetate resins, polyolefine resins, and copolymers thereof. The resin for forming the thermoplastic resin layer in the invention is not necessarily alkali-soluble, but is preferably alkali-soluble.

As the resin for forming the thermoplastic resin layer, at least one of the following specific examples can be used: a saponified product of an ethylene-acrylate copolymer; a saponified product of a styrene-(meth) acrylate copolymer; a styrene/(meth) acrylic acid/(meth)acrylate terpolymer; a saponified product of a vinyltoluene-(meth)acrylate copolymer; poly(meth)acrylate; a saponified product of a (meth) acrylate copolymer such as a butyl (meth)acrylate-vinyl acetate copolymer; and organic polymers, which are soluble in an alkaline aqueous solution, described in *Handbook of Plastic Performance (Plastic Seinō Binran) (edited and written by Japan Plastics Industry Federation and All Japan Plastic Molding Industry Association (Zen-Nippon Plastic Seikei Kōgyō Rengōkai), and published by Kogyo Chosakai Publishing Co., Ltd. on Oct. 25, 1968)*.

These resins are preferably used by mixture of two types as described below.

Specifically, two types can be selected from the above-listed resins, such that the weight-average molecular weight is 50,000 to 500,000 and the glass-transition temperature (Tg) is 0 to 140° C. (hereinafter, such a mixed resin with these conditions will be referred to as resin (A)), and preferably such that the weight-average molecular weight is 60,000 to 200,000 and the glass-transition temperature (Tg) is 30 to 110° C. Specific examples of the resin (A) include resins, which are soluble in an alkaline aqueous solution, described in Japanese Patent Application Publication (JP-B) Nos. 54-34327, 55-38961, 58-12577 and 54-25957, JP-A No. 61-134756, JP-B No. 59-44615, JP-A Nos. 54-92723, 54-99418, 54-137085, 57-20732, 58-93046, 59-97135 and 60-159743, OLS No. 3,504,254, and JP-A Nos. 60-247638, 60-208748, 60-214354, 60-230135, 60-258539, 61-169829, 61-213213, 63-147159, 63-213837, 63-266448, 64-55551, 64-55550, 2-191955, 2-199403, 2-199404, 2-208602 and 5-241340. Among them, a methacrylic acid/2-ethylhexyl acrylate/benzyl methacrylate/methyl methacrylate copolymer described in JP-A No. 63-147159 is particularly preferable.

Further, two types can also be selected from the above-listed various resins, such that the weight-average molecular weight is 3,000 to 30,000 and the glass-transition temperature (Tg) is 30 to 170° C. (hereinafter, such a mixed resin with these conditions will be referred to as resin (B)), and preferably such that the weight-average molecular weight is 4,000 to 20,000 and the glass-transition temperature (Tg) is 60 to 140° C. Preferred specific examples of the resin (B) can be selected from the resins described in the above-listed patent applications. Styrene/(meth)acrylic acid copolymers described in JP-B No. 55-38961 and JP-A No. 5-241340 are particularly preferable.

When the weight-average molecular weight of the resin (A) for forming the thermoplastic resin layer is less than 50,000 or the glass-transition temperature (Tg) thereof is lower than 0° C., reticulations may occur, and the thermoplastic resin may extrude peripherally during transfer to contaminate a permanent support. When the weight-average molecular weight of the resin (A) is more than 500,000 or the glass-transition temperature (Tg) thereof is higher than 140° C., air bubbles may enter space between pixels during transfer, and it may become hard to remove the thermoplastic resin with the alkaline aqueous solution.

The thickness of the thermoplastic resin is preferably no less than 6 μm. This is because, when the thickness of the thermoplastic resin is 5 μm or less, it is impossible to completely absorb unevenness of the base, which is 1 μm or more. The upper limit of the thickness of the thermoplastic resin is about 100 μm, and preferably about 50 μm, from the viewpoints of removability with alkaline aqueous solution and manufacturing aptitude.

As a solvent for preparing a coating solution of the thermoplastic resin layer in the invention, any solvent can be used without particular limitation as long as it dissolves the resin for forming the thermoplastic resin layer. Examples of the solvent include methyl ethyl ketone, n-propanol, and isopropanol.

Alkali-Soluble Intermediate Layer

As a resin for forming the intermediate layer is not particularly limited as long as it is alkali-soluble as described above. Examples of the resin include polyvinyl alcohol resins, polyvinyl pyrrolidone resins, cellulose resins, acrylamide resins, polyethylene oxide resins, gelatin, vinyl ether resins, polyamide resins, and copolymers thereof. Further, resins such as polyester, which are not alkali-soluble generally, can be made alkali-soluble by being copolymerized with a monomer having a carboxyl group or a sulfonic group, so as to be used for the intermediate layer.

Among them, polyvinyl alcohol is preferable. The saponification degree of the polyvinyl alcohol is preferably no less than 80%, and more preferably 83 to 98%.

The resins for forming the intermediate layer are preferably used in combination, and a mixture of polyvinyl alcohol and polyvinyl pyrrolidone is particularly preferably used. The mass ratio of polyvinyl pyrrolidone to polyvinyl alcohol is preferably 1/99 to 75/25, and more preferably 10/90 to 50/50. When the mass ratio is lower than 1/99, the surface state of the intermediate layer may deteriorate, and imperfect tight contact between the intermediate layer and the photosensitive resin layer applied thereto may occur. On the other hand, when the mass ratio is higher than 75/25, the oxygen blocking properties of the intermediate layer may decrease, and thereby the sensitivity thereof may decrease.

If necessary, additives such as a surfactant can also be added to the intermediate layer.

The thickness of the intermediate layer is preferably 0.1 to 5 $\mu$m, and more preferably 0.5 to 3 $\mu$m. When the thickness is 0.1 to 5 $\mu$m, the oxygen blocking properties thereof do not decrease, and time for removing the intermediate layer does not increase at the time of development.

A solvent for preparing a coating solution of the intermediate layer is not particularly limited as long as it dissolves the above-mentioned resins, but is preferably water. Further, a mixed solvent produced by mixing any one of the above-mentioned water-miscible organic solvents into water is also preferable. Preferred specific examples of the solvent are as follows: water, a mixture of water and methanol at the mass ratio of 90/10, a mixture of water and methanol at the mass ratio of 70/30, a mixture of water and methanol at the mass ratio of 55/45, a mixture of water and ethanol at the mass ratio of 70/30, a mixture of water and 1-propanol at the mass ratio of 70/30, a mixture of water and acetone at the mass ratio of 90/10, and a mixture of water and methyl ethyl ketone at the mass ratio of 95/5.—

Method for reducing surface potentials of the thermoplastic resin layer and the intermediate layer when the layers are separated from each other In order to reduce surface potentials of the thermoplastic resin layer and the intermediate layer, there are the following two methods.

1. Method in Which a Triboelectric Series of the Thermoplastic Resin Layer and that of the Intermediate Layer are Made Coincident With Each Other In the first method, a triboelectric series on a surface of the thermoplastic resin layer and that of the intermediate layer are made coincident with each other. The "triboelectric series" is made by contacting various objects with each other in a round-robin manner to electrostatically charge them and then sequentially arranging them by electrostatic property from positive to negative. The "triboelectric series" is described in, for example, *Handbook of Static Electricity* (*Seidenki Handbook*) (edited by Institute of Electrostatics Japan, and published by Ohmsha, Ltd. in 1981, p. 59). Specifically, in this method, a substance for changing the triboelectric series is added to the intermediate layer, and/or applied to the surface of the thermoplastic resin layer. The layer formed by applying the substance for changing the triboelectric series to the surface of the thermoplastic resin layer is particularly referred to as a "charge adjustment layer" in the invention.

Examples of the substance for changing the triboelectric series include methyl cellulose, ethyl cellulose, and gelatin. Among them, gelatin is most preferable.

2. Method in Which a Conductive Layer is Applied

In the second method, a conductive layer is provided on any part of the photosensitive transfer material. The "conductive layer" used in the invention means a "layer which decreases the surface resistivity of the temporary support or the photosensitive transfer material". The conductive layer generally contains an organic or inorganic conductive substance. Further, in the invention, the organic or inorganic conductive substance is referred to as a "conductive agent". Examples of the organic conductive substance include polymers with ionic conductivity (i.e., ion-conducting polymers) such as polyacrylic acid and polyethylene oxide, and polymers with electronic conductivity (i.e., electron-conducting polymers) such as polypyrrole and polyaniline. The ion-conducting polymers are described in, for example, *Application and Market of Water-Soluble Polymer* (*Suiyōsei-Kōbunshi no Ōyo to Shijō*) (edited by Shinji Nagatomo, and published by CMC Publishing Co., Ltd. in 1984, p. 285). The electron-conducting polymers are described in, for example, *Basics and Application of Conductive Polymer* (*Dōdensei-Kōbunshi no Kiso to Ōyō*) (edited by Katsumi Yoshino, and published by Industrial Publishing & Consulting, Inc. in 1988).

Examples of the inorganic conductive substance include fillers (conductive fillers) such as carbon, impalpable metallic powder, and impalpable metallic oxide powder. The fillers are described in, for example, *Developed Technology for Functional Filler* (*Kinōsei-Filler no Kaihatsu-Gijutsu*) (published by CMC Publishing Co., Ltd. in 1990, p. 98).

As the conductive filler, fine particles of tin oxide or antimony oxide are particularly preferable. A secondary particle of the fine particle of tin oxide or antimony oxide preferably has an average particle diameter of 300 nm or smaller. If the average particle diameter is larger than 300 nm, when the conductive layer exists on the surface of the photosensitive transfer material, the fine particles of tin oxide or antimony oxide may fall off during handling, and when the conductive layer exists inside the photosensitive transfer material, the surface state of the layer adjacent to the conductive layer may deteriorate.

The conductive substance is contained in the conductive layer preferably in an amount of 2 to 85% by mass, and more preferably in an amount of 5 to 75% by mass.

In the invention, the conductive layer has a surface resistivity of $1 \times 10^{14}$ $\Omega/\square$ or less, and preferably $1 \times 10^{13.5}$ $\Omega/\square$ or less, under an atmosphere of 25° C. and 30% RH.

In the invention, the conductive layer can be provided on any part of the photosensitive transfer material. However, it is preferable that the conductive layer is respectively provided on both sides, which are made after the thermoplastic resin layer and the intermediate layer have been separated from each other, i.e., on the temporary support and the thermoplastic resin layer side, and on the intermediate layer side. Preferred embodiments of the photosensitive transfer material, which has the temporary support, the thermoplastic resin layer, the alkali-soluble intermediate layer, and the alkali-soluble photosensitive resin layer including a pigment in this order, are as follows.

1. A conductive layer is provided on a rear surface of the temporary support, and the alkali-soluble intermediate layer is made as a conductive layer.
2. A conductive layer is provided on a front surface of the temporary support, and the alkali-soluble intermediate layer is made as a conductive layer.
3. A conductive layer is provided on a rear surface of the temporary support, and another conductive layer is provided between the alkali-soluble intermediate layer and the photosensitive resin layer (i.e., two conductive layers are provided in total).
4. A conductive layer is provided on a front surface of the temporary support, and another conductive layer is provided between the alkali-soluble intermediate layer and the photosensitive resin layer (i.e., two conductive layers are provided in total).

(The front surface of the temporary support is the surface to which the thermoplastic resin layer is applied, and the rear surface of the temporary support is the surface opposite to the front surface.)

Further, it is also preferable that the layer containing the substance for changing the triboelectric series, i.e., the charge adjustment layer, is combined with the conductive layer. Specifically, it is preferable that a conductive layer is further provided on the thermoplastic resin layer including the charge adjustment layer so as to form an independent conductive layer adjacent to the thermoplastic resin layer, and/or that the intermediate layer is formed as a conductive layer.

Conditions of Separation

Separation is carried out between the thermoplastic resin layer and the intermediate layer. The separation speed and the separation angle are not particularly limited. However, the separation speed is preferably 0.01 to 15 m/min, and more preferably 0.1 to 5 m/min. The separation angle may be any angle within a range from 0° to 180°.

Photosensitive Resin Layer

As a resin for forming the photosensitive resin layer in the invention, known photopolymerizable compositions can be used. Preferred specific examples of the resin are described in, for example, Japanese Patent Application No. 2-82262. The "resin" used herein includes monomers and oligomers which polymerize to become a resin when exposed to light.

The photosensitive resin layer in the invention includes not only a resin but also a pigment. Preferred examples of the type, size and the like of the pigment are described in, for example, JP-A No. 11-149008.

If necessary, additives such as a surfactant may be contained in the photosensitive resin layer in the invention. As a solvent for preparing a coating solution of the photosensitive resin layer in the invention, any solvent can be used without particular limitation as long as it dissolves the resin for forming the photosensitive resin layer. Examples of the solvent include methyl ethyl ketone, n-propanol, and iso-propanol.

In order to protect the photosensitive resin layer from contamination and damage during storage, a thin cover sheet is preferably provided on the photosensitive resin layer. Although the cover sheet may be made of the same material as or similar material to the temporary support, the cover sheet must be easily separated from the photosensitive resin layer. Preferred examples of the cover sheet include silicone paper, and a polyolefine or polytetrafluoroethylene sheet. The thickness of the cover sheet is preferably about 5 to 100 $\mu$m. The cover sheet is particularly preferably a polyethylene or polypropylene film having a thickness of 10 to 30 $\mu$m.

The photosensitive transfer material of the invention is advantageously used for producing a color filter for a liquid crystal display or the like, and a protective layer for a color filter, as well as for producing a multi-color image and a printed-wiring board.

In order to produce a printed-wiring board, a known copper-clad laminate is used as a substrate. In order to produce a color filter, a known glass plate, a known soda glass plate on which a silicon oxide film is formed, or the like is used as a substrate.

According to the present invention, in production of such a printed-wiring board or color filter, when the temporary support is separated after a lamination step, the temporary support and the surface separated from the temporary support (i.e., the surface of the layer directly applied to the temporary support at a photosensitive transfer material formation step) are not electrostatically charged. Therefore, no dust is attracted and no thin-film transistor is broken by static electricity. As a result, even at a high speed, the printed-wiring board, color filter or the like can be stably produced.

Method for Producing a Color Filter

Next, a method for producing a color filter by using the photosensitive transfer material of the invention will be described.

First, the cover sheet of the photosensitive transfer material is removed, and the photosensitive resin layer is laminated on the substrate under pressure and heat. Conventionally known laminators such as a vacuum laminator can be used for the lamination, and an auto-cut laminator can also be used to increase productivity. After that, the temporary support is removed by separating the thermoplastic resin layer and the intermediate layer from each other. Thereafter, the photosensitive resin layer is exposed through a predetermined mask and the intermediate layer, and then, unnecessary portions of the intermediate layer and the photosensitive resin layer are removed. The removal is carried out, in a known way, by immersion in a solvent or an aqueous developer, particularly in an alkaline aqueous solution, by application of a processing solution from a spray, and by scrub with a brush, or by process with ultrasonic radiation.

In the method for producing a color filter of the present invention, when the thermoplastic resin layer and the intermediate layer are separated from each other at a separation speed of 1 m/min under an atmosphere of 25° C. and 30% RH, both an absolute value of a surface potential of the separated thermoplastic resin layer and that of the separated intermediate layer are no more than 5 kV. Accordingly, electrostatic charge can be reduced, and problems resulting from the electrostatic charge can be thereby restricted.

If these steps are repeated plural times by using photosensitive transfer materials which have photosensitive resin layers colored differently from each other, a color filter for a multi-color image can be produced.

EXAMPLES

Hereinafter, the present invention will be further described in detail with examples, but is not limited to these examples.

Comparative Example

1) Temporary Support

Biaxially oriented polyethylene terephthalate film having a thickness of 75 $\mu$m was used as a temporary support.

2) Thermoplastic Resin Layer

| | |
|---|---:|
| polymer 1: copolymer of methyl methacrylate/2-ethylhexyl acrylate/benzyl methacrylate/methacrylic acid at a ratio of 55/30/10/5 (weight-average molecular weight: 100,000) | 60 g |
| polymer 2: copolymer of styrene/acrylic acid at a ratio of 65/35 (weight-average molecular weight: 10,000) | 140 g |
| * The composition ratios of the above copolymers represent molar ratios of the monomers. | |
| polymer 3: polyester resin (Vylon 220 manufactured by TOYOBO Co., Ltd.) | 0.5 g |
| plasticizer: compound produced by dehydro-condensing two equivalents of octaethylene glycol monomethacrylate to bisphenol A (BPE-500 manufactured by Shin-Nakamura Chemical Co., Ltd.) | 45 g |
| fluorinated surfactant (Megafac F176PF manufactured by DAINIPPON INK AND CHEMICALS, INCORPORATED) | 1 g |
| n-propyl alcohol | 500 g |

The above components were mixed to prepare a coating solution of a thermoplastic resin layer.

The coating solution of a thermoplastic resin layer was applied to a surface of the temporary support, and then the coating layer was dried at 100° C. for 2 minutes, so as to form a thermoplastic resin layer having a thickness of 10 µm.

3) Formulation of a Coating Solution of an Intermediate Layer

| | |
|---|---|
| polyvinyl alcohol (PVA205 manufactured by Kuraray Co., Ltd.; saponification degree: 80%) | 30 g |
| polyvinyl pyrrolidone (PVP-K90 manufactured by GAF Corporation) | 3 g |
| polyurethane (Hydran WLS-202 manufactured by DAINIPPON INK AND CHEMICALS, INCORPORATED; water dispersion having a solid content of 35%) | 30 g |
| distilled water | 487 g |

The above components were mixed to prepare a coating solution of an intermediate layer.

The coating solution of an intermediate layer was applied to the thermoplastic resin layer on the temporary support, and then the coating layer was dried at 100° C. for 2 minutes, so as to form an intermediate layer having a thickness of 1.8 µm.

4) Preparation of Coating Solutions of Photosensitive Resin Layers

Coating solutions of red, blue and green photosensitive resin layers based on formulation shown in Table 1, and a coating solution of a black photosensitive resin layer based on formulation described later, were applied to the intermediate layer, and then the coating layers were dried at 100° C. for 2 minutes, so as to form red, blue and green photosensitive resin layers each having a dry thickness of 2.3 µm, and a black photosensitive resin layer having a dry thickness of 1.6 µm.

TABLE 1

| | Red | Green | Blue |
|---|---|---|---|
| benzyl methacrylate/methacrylic acid copolymer (molar ratio: 73/27; molecular weight: 30,000) (g) | 60 | 33.5 | 34.1 |
| pentaerythritol hexacrylate (g) | 28.4 | 25.2 | 32.3 |
| fluorinated surfactant (Megafac F177P manufactured by DAINIPPON INK AND CHEMICALS, INCORPORATED) (g) | 0.37 | 0.19 | 0.3 |
| 2,4-bis(trichloromethyl)-6-[4-(N,N-diethoxycarbonylmethyl)]-8-triazine (g) | 1.31 | 0 | 1.52 |
| 2-trichloromethyl-5-(p-styryl)-1,3,4-oxadiazole (g) | 0 | 1.2 | 0 |
| phenothiazine (g) | 0.02 | 0.02 | 0.026 |
| Chromostal Red A2B (red) (g) | 27 | 0 | 0 |
| Paleotol Yellow L1820 (g) | 10.3 | 23 | 0 |
| Heliochen Blue L6700F (blue) (g) | 0 | 0 | 25.6 |
| Monastral Green (green) (g) | 0 | 23 | 0 |
| methoxypropylene glycol acetate (g) | 310 | 310 | 310 |
| methyl ethyl ketone (g) | 460 | 460 | 460 |

5) Composition of a Coating Solution for Forming a Black Photosensitive Resin Layer With a Light-Shielding Property

| | |
|---|---|
| benzyl methacrylate/methacrylic acid copolymer (molar ratio: 70/30; acid value: 104 mgKOH/g; weight-average molecular weight: 30,000) | 21.0 g |
| 2-ethylhexyl acrylate/methacrylic acid/methyl methacrylate/benzyl methacrylate copolymer (molar ratio: 7/15/73/5; acid value: 77 mgKOH/g; weight-average molecular weight: 80,000) | 14.7 g |
| dipentaerythritol hexacrylate | 26.8 g |
| 2,4-bis(trichloromethyl)-6-[4-(N,N-diethoxycarbomethyl)-3-bromophenyl]-s-triazine | 1.32 g |
| carbon black | 27.0 g |
| Pigment Blue 15:6 | 5.70 g |
| Pigment Violet 23 | 3.57 g |
| hydroquinone monomethyl ether | 0.02 g |
| F117P (surfactant manufactured by DAINIPPON INK AND CHEMICALS, INCORPORATED) | 0.09 g |
| propylene glycol monomethyl ether acetate | 400 g |
| methyl ethyl ketone | 600 g |

6) Preparation of a Photosensitive Transfer Material

A polypropylene sheet having a thickness of 15 µm was overlaid and contact-bonded at a room temperature onto the obtained red, blue, green and black sample photosensitive resin layers, so as to prepare a four-colored photosensitive transfer material.

Evaluation of Surface Resistivity

The sample, from which the cover film had been removed, was laminated on a glass substrate having a thickness of 1.1 mm by using a laminator. The lamination was carried out under conditions in which the pressure was 10 kg/cm and the temperature was 130° C. The sample was then moisture-conditioned for 24 hours under an atmosphere of 25° C. and 30% RH, and thereafter the thermoplastic resin layer and the intermediate layer were separated from each other. Then, an electrode, in which stainless plates each having a length of 10 cm and a width of 1 mm were disposed at intervals of 1 cm, was pressed onto the separated surface of the thermoplastic resin layer of the sample with a pressure of 2 kg, and a DC voltage of 100 V was applied thereto. The surface resistivity Log SR (logarithmic value) was calculated from the current value i, which was obtained after the voltage had been applied for 1 minute, by using the following formula:

$$Log\ SR = 100/(i \times 0.1 \times 0.1).$$

Log SR for the separated surface of the intermediate layer was also calculated in the same manner. The measurement was carried out under an atmosphere of 25° C. and 30% RH. The results are shown in Table 2.

Evaluation of Surface Potential

The sample, from which the cover film had been removed, was laminated on a glass substrate having a thickness of 1.1 mm by using a laminator. The lamination was carried out under conditions in which the pressure was 10 kg/cm and the temperature was 130° C. The sample was then moisture-conditioned for 24 hours under an atmosphere of 25° C. and 30% RH, and thereafter the thermoplastic resin layer and the intermediate layer were separated from each other. Then, the surface potential for the separated surface of the thermoplastic resin layer was measured by using a surface electrometer (SK-030 type manufactured by KEYENCE CORPORATION). The measurement was carried out 1 minute after the layers had been separated. The surface potential for the separated surface of the intermediate layer was also measured in the same manner. The results are shown in Table 2.

Example 1

A photosensitive transfer material for Example 1 was prepared in the same manner as in Comparative example except that the following temporary support was used and the intermediate layer was changed as follows. The results are shown in Table 2.

1) Temporary Support

The following coating solution was applied to a surface of a polyethylene terephthalate support such that the dry thickness thereof is 0.15 μm, and then the coating layer was dried at 180° C. for 1 minute, so as to form a conductive layer.

Formulation of a Conductive Layer

| | |
|---|---|
| binder (acrylic emulsion: Jurimer ET410 manufactured by Nippon Junyaku Co., Ltd.; solid content: 20%) | 15.5 g |
| fine particles of conductive tin oxide/antimony oxide described in Example 1 of JP-A No. 8-36239 (water dispersion having a solid content of 30%) | 16 g |
| polyoxyethylene phenyl ether | 0.1 g |
| epoxy compound (Denacol EX-614B manufactured by Nagase Chemical Co., Ltd.) | 0.3 g |
| Distilled water | 68.1 g |

Next, the following coating solution was applied to the conductive layer, and then the coating layer was dried at 180° C. for 1 minute, so as to form a backing protective layer having a dry thickness of 0.04 μm.

Formulation of a Backing Protective Layer

| | |
|---|---|
| binder (polyolefinic emulsion: Chemipearl S-120 manufactured by Mitsui Petrochemical Industries, Ltd.; solid content: 27%) | 3 g |
| colloidal silica (Snowtex C manufactured by Nissan Chemical Industries, Ltd.; 20%) | 2 g |
| epoxy compound (Denacol EX-614B manufactured by Nagase Chemical Co., Ltd.) | 0.1 g |
| distilled water | 94.9 g |

A temporary support was prepared in the above-described manner.

2) Formulation of a Coating Solution of an Intermediate Layer

| | |
|---|---|
| methanol | 450 g |
| polyvinyl alcohol (PVA205 manufactured by Kuraray Co., Ltd.; saponification degree: 80%) | 30 g |
| Polyvinyl pyrrolidone (PVP-K90 manufactured by GAF Corporation) | 3 g |
| polyurethane (Hydran WLS-202 manufactured by DAINIPPON INK AND CHEMICALS, INCORPORATED; water dispersion having a solid content of 35%) | 80 g |
| conductive agent (polyaniline sulfonic acid: aqua Pass manufactured by Mitsubishi Rayon Co., Ltd.; 5%) | 174 g |
| distilled water | 308 g |

Example 2

A photosensitive transfer material for Example 2 was prepared in the same manner as in Example 1 except that the temporary support of Comparative example was used and the formulation of the intermediate layer was changed as follows. The results are shown in Table 2.

1) Formulation of a Coating Solution of an Intermediate Layer

| | |
|---|---|
| polyvinyl alcohol (PVA205 manufactured by Kuraray Co., Ltd.; saponification degree: 80%) | 30 g |
| polyvinyl pyrrolidone (PVP-K90 manufactured by GAF Corporation) | 3 g |
| polyurethane (Hydran WLS-202 manufactured by DAINIPPON INK AND CHEMICALS, INCORPORATED; 35%) | 30 g |
| conductive agent (polyvinylbenzyl trimethyl ammonium chloride: PL-206 manufactured by TOHO Chemical Industry Co., Ltd.; 34%) | 26 g |
| distilled water | 461 g |
| methanol | 450 g |

The above components were mixed to prepare a coating solution of an intermediate layer.

Example 3

A photosensitive transfer material for Example 3 was prepared in the same manner as in Example 1 except that the formulation of the intermediate layer was changed as follows. The results are shown in Table 2.

1) Formulation of a Coating Solution of an Intermediate Layer

| | |
|---|---|
| polyvinyl alcohol (PVA205 manufactured by Kuraray Co., Ltd.; saponification degree: 80%) | 30 g |
| polyvinyl pyrrolidone (PVP-K90 manufactured by GAF Corporation) | 3 g |
| polyurethane (Hydran WLS-202 manufactured by DAINIPPON INK AND CHEMICALS, INCORPORATED; 35%) | 30 g |
| conductive agent (fine particles of conductive tin oxide/antimony oxide described in Example 1 of JP-A No. 8-36239; water dispersion having a solid content of 30%) | 100 g |
| distilled water | 387 g |
| methanol | 450 g |

The above components were mixed to prepare a coating solution of an intermediate layer.

TABLE 2

| | Conductive layer (on the temporary support and thermoplastic resin layer side) | Conductive layer (on the intermediate layer side) | Surface resistivity (on the intermediate layer side)/ log Ω | Surface potential (on the intermediate layer side)/ kV |
|---|---|---|---|---|
| Comparative example | not applied | not applied | 14.1 | 25.8 |
| Example 1 | applied (to a rear surface of the temporary support) | applied | 12.2 | 0 |
| Example 2 | not applied | applied | 11.8 | 0 |
| Example 3 | applied (to a rear surface of the temporary support) | applied | 11.9 | 0 |

As seen clearly from Table 2, the surface potential of the separated intermediate layer in Comparative example was 25.8 kV, while each of those in Examples 1 to 3 of the present invention was 0 kV. Thus, in production of a printed-wiring board or color filter by using the photosensitive transfer material of the invention, when the thermoplastic resin layer and the intermediate layer are separated from each other after a lamination step, the separated surfaces thereof are not electrostatically charged. Therefore, no dust is attracted and no thin-film transistor is broken by static electricity. As a result, even at a high speed, the printed-wiring board, color filter or the like can be stably produced.

What is claimed is:

1. A photosensitive transfer material comprising a temporary support, a thermoplastic resin layer, an alkali-soluble intermediate layer, and an alkali-soluble photosensitive resin layer including a pigment in this order;

wherein, when said thermoplastic resin layer and said intermediate layer are separated from each other at a separation speed of 1 m/min under an atmosphere of 25° C. and 30% RH, both an absolute value of a surface potential of the separated thermoplastic resin layer and that of the separated intermediate layer are no more than 5 kV.

2. A photosensitive transfer material according to claim 1, wherein both said absolute value of the surface potential of the separated thermoplastic resin layer and that of the separated intermediate layer are no more than 1 kV.

3. A photosensitive transfer material according to claim 1, wherein both a surface resistivity of the separated surface of said thermoplastic resin layer and that of said intermediate layer under an atmosphere of 25° C. and 30% RH are no more than $1\times10^{14}$ $\Omega/\square$.

4. A photosensitive transfer material according to claim 1, wherein said intermediate layer contains a conductive agent.

5. A photosensitive transfer material according to claim 4, wherein said conductive agent is a conductive filler.

6. A photosensitive transfer material according to claim 5, wherein said conductive filler comprises fine particles of tin oxide or antimony oxide.

7. A photosensitive transfer material according to claim 6, wherein a secondary particle of said tin oxide or said antimony oxide has an average particle diameter of 300 nm or smaller.

8. A photosensitive transfer material according to claim 4, wherein said conductive agent is an electron-conducting polymer.

9. A photosensitive transfer material according to claim 8, wherein said electron-conducting polymer is polyaniline.

10. A photosensitive transfer material according to claim 4, wherein said conductive agent is an ion-conducting polymer.

11. A photosensitive transfer material according to claim 10, wherein said ion-conducting polymer is a cationic polymer.

12. A photosensitive transfer material according to claim 4, further comprising a conductive layer on a surface of said temporary support.

13. A photosensitive transfer material according to claim 1, further comprising a conductive layer on a surface of said temporary support, and a conductive layer between said intermediate layer and said photosensitive resin layer.

14. A method for producing a color filter by using a photosensitive transfer material comprising a temporary support, a thermoplastic resin layer, an alkali-soluble intermediate layer, and an alkali-soluble photosensitive resin layer including a pigment in this order; said method comprising steps of:

laminating said photosensitive transfer material on a substrate; and separating said thermoplastic resin layer and said intermediate layer from each other;

wherein, when said thermoplastic resin layer and said intermediate layer are separated from each other at a separation speed of 1 m/min under an atmosphere of 25° C. and 30% RH, both an absolute value of a surface potential of the separated thermoplastic resin layer and that of the separated intermediate layer are no more than 5 kV.

15. A method for producing a color filter according to claim 14, wherein both said absolute value of the surface potential of the separated thermoplastic resin layer and that of the separated intermediate layer are no more than 1 kV.

16. A method for producing a color filter according to claim 14, wherein both a surface resistivity of the separated surface of said thermoplastic resin layer and that of said intermediate layer under an atmosphere of 25° C. and 30% RH are no more than $1\times10^{14}$ $\Omega/\square$.

* * * * *